United States Patent
Lee

(10) Patent No.: US 9,249,012 B2
(45) Date of Patent: Feb. 2, 2016

(54) METHOD AND DEVICE OF MEMS PROCESS CONTROL MONITORING AND PACKAGED MEMS WITH DIFFERENT CAVITY PRESSURES

(71) Applicant: mCube Inc., San Jose, CA (US)

(72) Inventor: Te-Hsi "Terrence" Lee, San Jose, CA (US)

(73) Assignee: mCube, Inc., San Jose, CA (US)

( * ) Notice: Subject to any disclaimer, the term of this patent is extended or adjusted under 35 U.S.C. 154(b) by 0 days.

(21) Appl. No.: 14/521,441

(22) Filed: Oct. 22, 2014

(65) Prior Publication Data

US 2015/0111332 A1 Apr. 23, 2015

Related U.S. Application Data

(60) Provisional application No. 61/894,910, filed on Oct. 23, 2013.

(51) Int. Cl.
*H01L 21/30* (2006.01)
*B81C 1/00* (2006.01)
*B81C 99/00* (2010.01)

(52) U.S. Cl.
CPC ......... *B81C 1/00269* (2013.01); *B81C 1/00198* (2013.01); *B81C 99/004* (2013.01)

(58) Field of Classification Search
CPC .................. H01L 2924/00; H01L 2924/0002; H01L 2924/1305; H01L 2924/13055; H01L 2924/13091; H01L 2924/1461; H01L 29/84; H01L 21/02; H01L 21/02126; H01L 21/02356; H01L 21/3086; H01L 21/3088; H01L 21/31
USPC .............. 438/50–51, 462, 479; 257/415, 481, 257/599, E29.324, E21.002
See application file for complete search history.

(56) References Cited

U.S. PATENT DOCUMENTS 8,164,171 B2 4/2012 Lin et al.
8,205,498 B2 6/2012 Hsu et al.
(Continued)

FOREIGN PATENT DOCUMENTS

CN 102854998 A 1/2013
TW 201020548 A 1/2010
(Continued)

OTHER PUBLICATIONS

Search Report for European patent application EP14171673.8 (Nov. 10, 2014), 8 pages.
(Continued)

*Primary Examiner* — Mark A Laurenzi
(74) *Attorney, Agent, or Firm* — Kilpatrick Townsend & Stockton LLP

(57) ABSTRACT

A method for fabricating an integrated MEMS device and the resulting structure therefore. A control process monitor comprising a MEMS membrane cover can be provided within an integrated CMOS-MEMS package to monitor package leaking or outgassing. The MEMS membrane cover can separate an upper cavity region subject to leaking from a lower cavity subject to outgassing. Differential changes in pressure between these cavities can be detecting by monitoring the deflection of the membrane cover via a plurality of displacement sensors. An integrated MEMS device can be fabricated with a first and second MEMS device configured with a first and second MEMS cavity, respectively. The separate cavities can be formed via etching a capping structure to configure each cavity with a separate cavity volume. By utilizing an outgassing characteristic of a CMOS layer within the integrated MEMS device, the first and second MEMS cavities can be configured with different cavity pressures.

9 Claims, 10 Drawing Sheets

(56) References Cited

U.S. PATENT DOCUMENTS

| | | |
|---|---|---|
| 8,516,886 B2 | 8/2013 | Acar et al. |
| 8,878,312 B2 | 11/2014 | Hung et al. |
| 2003/0196490 A1 | 10/2003 | Cardarelli |
| 2004/0121564 A1* | 6/2004 | Gogoi ............ 438/479 |
| 2009/0309203 A1 | 12/2009 | Seppala et al. |
| 2010/0071467 A1 | 3/2010 | Nasiri et al. |
| 2011/0030473 A1 | 2/2011 | Acar |
| 2011/0031565 A1 | 2/2011 | Marx et al. |
| 2011/0121416 A1 | 5/2011 | Quevy et al. |
| 2011/0265574 A1* | 11/2011 | Yang ............ 73/658 |
| 2012/0012970 A1 | 1/2012 | Xu et al. |
| 2012/0223726 A1 | 9/2012 | Zhang et al. |
| 2012/0326248 A1* | 12/2012 | Daneman et al. ............ 257/415 |
| 2013/0042686 A1 | 2/2013 | Lin et al. |
| 2013/0247662 A1 | 9/2013 | Jin et al. |
| 2013/0247666 A1 | 9/2013 | Acar |
| 2013/0328139 A1 | 12/2013 | Acar |

FOREIGN PATENT DOCUMENTS

| | | |
|---|---|---|
| TW | 201110274 A | 3/2011 |
| TW | 201117349 A | 5/2011 |
| TW | 201213764 A | 4/2012 |
| TW | 201229516 A | 7/2012 |
| TW | 201238032 A | 9/2012 |
| WO | WO2010092399 A2 | 8/2010 |

OTHER PUBLICATIONS

Search Report and Written Opinion for European patent application EP14152747 (Sep. 3, 2014), 11 pages.

Sun Sensing and control electronics design for capacitive CMOS-MEMS inertial sensors, PhD. Dissertation University of Florida (copyright 2002), sections 2.2.4, 7.3, chapters 3 and 6.

Tatar et al. "Quadrature-Error Compensation and Corresponding Effects on the Performance of Fully Decoupled MEMS Gyroscopes," Journal of Microelectromechanical Systems, vol. 21, pp. 656-667 (Jun. 2012).

Xie "Gyroscope and Micromirror Design Using Vertical Axis CMOS-MEMS Actuation and Sensing," PhD. Dissertation Carnegie Institute of Technology (copyright 2002), sections 3.2, 5.3.2.2, 6.2.8, chapter 6.

Taiwan Patent Office Office Action for patent application TW103103000 (May 11, 2015).

China Intellectual Property Office office action for application CN201310076476.9 dated Apr. 15, 2015.

Office Action issued by the Taiwan Patent Office for patent application TW102108387 (Feb. 17, 2015).

Taiwan Patent Office Office Action for patent application TW103103001 (Aug. 6, 2015).

* cited by examiner

METHOD AND DEVICE OF MEMS PROCESS CONTROL MONITORING AND PACKAGED MEMS WITH DIFFERENT CAVITY PRESSURES

CROSS-REFERENCES TO RELATED APPLICATIONS

The present application claims priority to U.S. Provisional Patent application No. 61/894,910, filed Oct. 23, 2013, commonly owned and incorporated by reference in its entirety.

The present application is also related to and incorporates by reference, for all purposes, the following provisional patent applications: U.S. Provisional App. 61/835,510, filed Jun. 14, 2013, U.S. Provisional App. 61/832,657, filed Jun. 7, 2013, U.S. Provisional App. 61/757,088, filed Jan. 25, 2013, and U.S. Provisional App. 61/757,085, filed Jan. 25, 2013.

BACKGROUND OF THE INVENTION

The present invention is directed to MEMS (Micro-Electro-Mechanical-Systems). More specifically, embodiments of the invention provide methods and structure for improving integrated MEMS devices, including inertial sensors and the like.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving fabrication techniques for IC devices and MEMS are highly desired.

BRIEF SUMMARY OF THE INVENTION

The present invention is directed to integrated MEMS (Micro-Electro-Mechanical-Systems) IC (Integrated Circuit) devices. More specifically, embodiments of the invention provide a methods for fabricating an integrated MEMS devices with different cavity pressures and a pressure control monitor. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much greater range of applicability.

One of the most critical factors in the process control of MEMS devices operating under vacuum conditions is the air pressure inside capping or package cavities. These kinds of MEMS devices include gyroscopes, resonators, and other like devices. One of the primary process issues that degrade the vacuum conditions of these devices involve leaking at capping/package interfaces and outgassing from inside capping or package cavities.

From a process control point of view, one of the most important practices used to improve vacuum conditions from MEMS devices is to identify and decouple abnormal leaking and outgassing in the MEMS fabrication process. Once identified, appropriate correcting process fixes or tunings can be applied. However, identifying such issues is extremely challenging as vacuum degradation from leaking and outgassing cannot be distinguished readily by prior vacuum sensitive structures, such as gyroscopes, resonators, or Pirani gauges and the like. Additionally, the physical and electrical failure analysis for such devices is difficult, especially in cases of fine leaking and outgassing. Embodiments of the present invention provide methods for monitoring MEMS device fabrication processes and structures for integrated MEMS devices having pressure control monitors.

In integrated MEMS design, certain MEMS devices require different operating air pressures, some examples being a gyroscope and an accelerometer. This means that a package with two MEMS devices requiring different operating pressures will require either separated MEMS packages or a single MEMS package with different packaging pressures. Both design approaches are challenging and complex, which tends to lead to low production yield. Addressing this design issue is a major key in developing a successful integrated multiple MEMS device, such as an integrated MEMS gyroscope and accelerometer.

A single MEMS package design is desirable as it provides a smaller form factor, smaller die size, and better process complexity. However, implementing different package pressures during a single MEMS packaging process can be extremely difficult. For example, using conformal thin-film enclosures of separated package cavities is not mechanically or process-oriented robust. Embodiments of the present invention provide a method and structure for a single MEMS package with different vacuum pressures using intrinsic outgassing. The outgassing can come from exposed CMOS layers that are enclosed in a package cavity. In a specific embodiment, intrinsic outgassing can be used to create different final cavity air pressures in separated package cavities with significantly different volumes.

Many benefits are achieved by way of embodiments of the present invention over conventional techniques. Methods and structures of a process control monitor can be used to identify and decouple abnormal leaking and outgassing in the MEMS fabrication process. This allows for appropriate correcting process fixes or tunings to applied be applied, which can improve device performance and production yield. Methods and structures of an integrated multiple MEMS device having different cavity pressures allow multiple MEMS devices to be integrated on a single chip while maintaining separate cavity environments with appropriate operating air pressures. Depending upon the embodiment, one or more of these benefits may be achieved. These and other benefits will be described in more detail throughout the present specification and more particularly below.

Various additional objects, features, and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

The present invention is directed to integrated MEMS (Micro-Electro-Mechanical-Systems) IC (Integrated Circuit) devices. More specifically, embodiments of the invention provide a method and structure for a MEMS fabrication, including one or more discrete MEMS devices. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much greater range of applicability.

Figure 1:
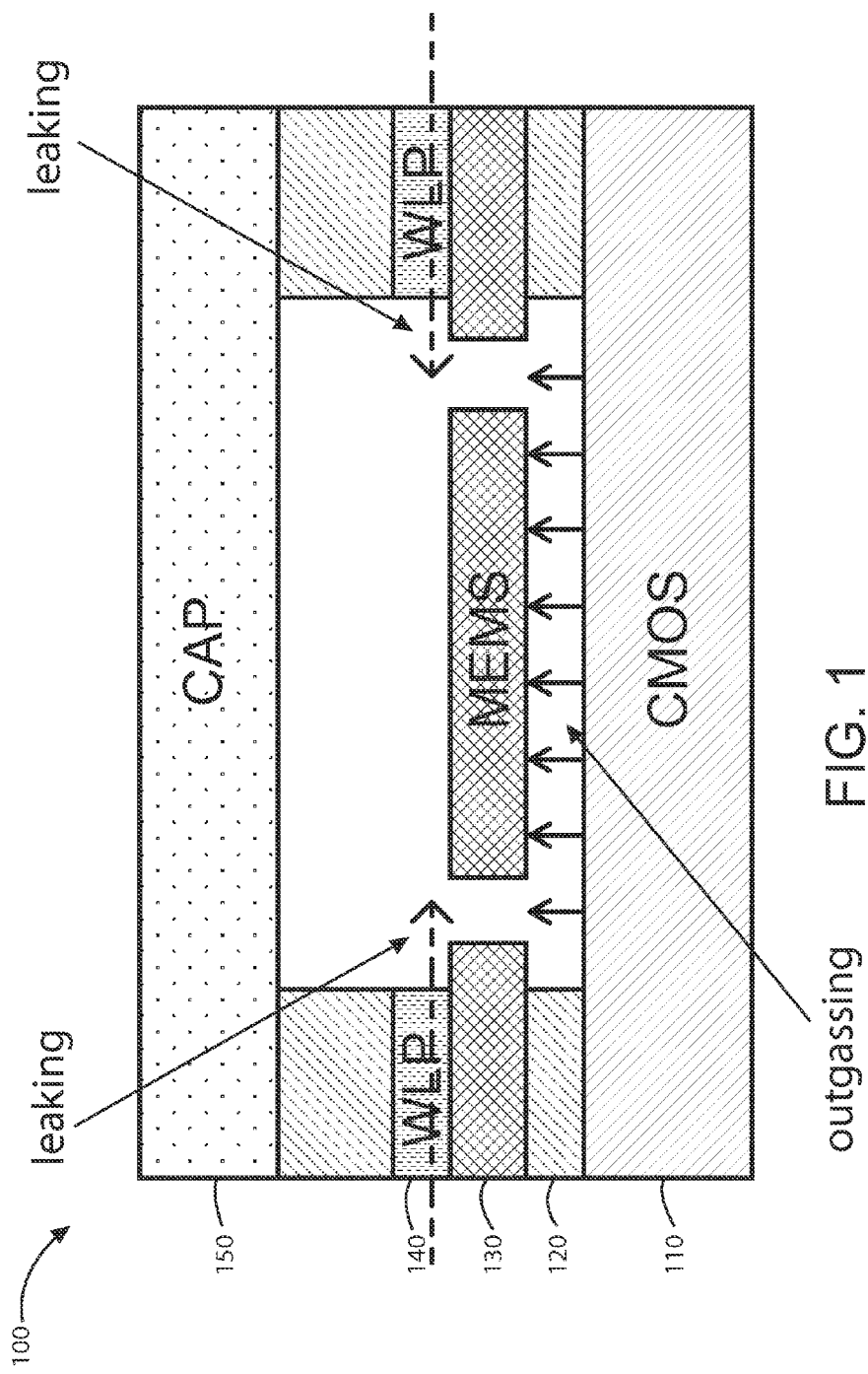
FIG. 1 illustrates a simplified diagram of an integrated MEMS device according to an embodiment of the present invention.

FIG. 1 illustrates a simplified diagram of an integrated MEMS device according to an embodiment of the present invention. This figure shows a cross-sectional view of an integrated MEMS device with potential leaking regions and potential outgassing regions. Device 100 is configured from bottom to top with the following device layers: a semiconductor substrate 110, a material layer 120, a MEMS material layer 130, an interface layer 140, and a cap layer 150. Those of ordinary skill in the art will recognize other variations, modifications, and alternatives.

In an embodiment, the semiconductor substrate 110 can be a CMOS substrate having a plurality of CMOS devices formed thereon. The semiconductor substrate 110 can have an upper surface region, which can be associated with an outgassing characteristic. The material layer 120 overlies the substrate 110 and can include a dielectric material with lower cavity region or lower volumetric cavity. The interface layer 140 can include a WLP (Wafer Level Packaging) material layer. The MEMS layer 130 overlies the lower volumetric cavity and the cap layer 150 encloses an upper volumetric cavity. In this embodiment, the upper volumetric cavity and the lower volumetric cavity are connected through openings in the MEMS layer 130.

One of the most critical factors in the process control of MEMS devices operating under vacuum conditions is the air pressure inside capping or package cavities. These kinds of MEMS devices include gyroscopes, resonators, and other like devices. One of the primary process issues that degrade the vacuum conditions of these devices involve leaking at capping/package interfaces and outgassing from inside capping or package cavities. Here, potential leaking regions 101 and potential outgassing regions 102 are shown within a vicinity of the interface layer 140 and within a vicinity of the upper surface region of the CMOS substrate 110, respectively.

From a process control point of view, one of the most important practices used to improve vacuum conditions from MEMS devices is to identify and decouple abnormal leaking and outgassing in the MEMS fabrication process. Once identified, appropriate correcting process fixes or tunings can be applied. However, identifying such issues is extremely challenging as vacuum degradation from leaking and outgassing cannot be distinguished readily by prior vacuum sensitive structures, such as gyroscopes, resonators, or Pirani gauges and the like. Additionally, the physical and electrical failure analysis for such devices is difficult, especially in cases of fine leaking and outgassing. Embodiments of the present invention provide methods for monitoring MEMS device fabrication processes and structures for integrated MEMS devices having pressure control monitors.

Figure 2:
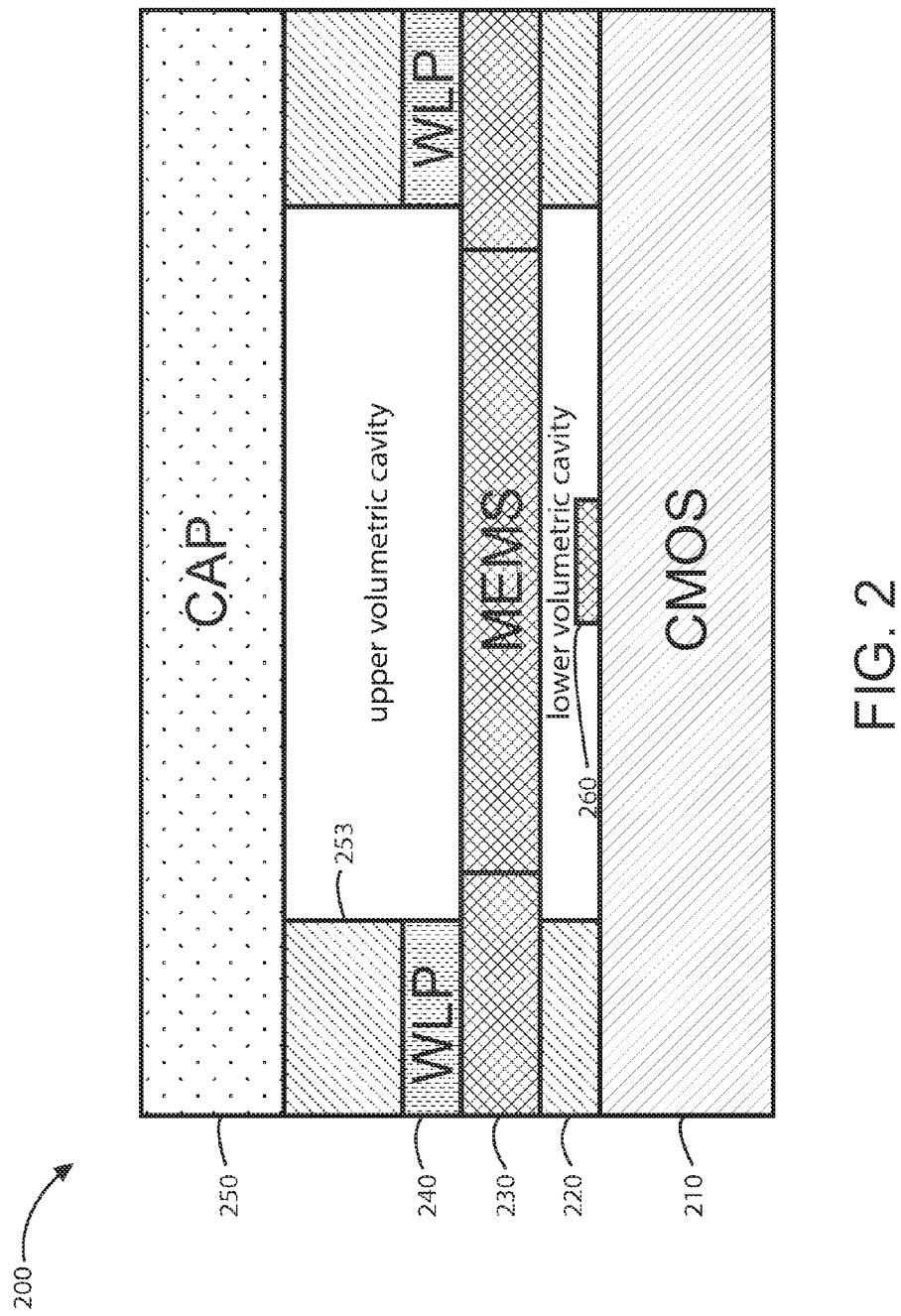
FIGS. 2-4 illustrates simplified diagrams of an integrated MEMS device using a Process Control Monitor according to an embodiment of the present invention.

FIG. 2 illustrates a simplified diagram of an integrated MEMS device using a Process Control Monitor according to an embodiment of the present invention. This figure shows a cross-sectional view of an integrated MEMS device 200, which is configured from bottom to top with the following device layers: a semiconductor substrate 210, a material layer 220, a MEMS material layer 230, an interface layer 240, and a cap layer 250. Those of ordinary skill in the art will recognize other variations, modifications, and alternatives.

In an embodiment, the semiconductor substrate 210 can be a CMOS substrate having a plurality of CMOS devices formed thereon. The semiconductor substrate 210 can have an upper surface region, which can be associated with an outgassing characteristic. The material layer 220 overlies the substrate 210 and can include a dielectric material with lower cavity region or lower volumetric cavity. In a specific embodiment, the material layer 220 can include sidewall structures that are configured on semiconductor substrate 210. These sidewall structures can enable definition of the lower volumetric cavity.

The interface layer 240 can include a WLP material, which can be a bonding interface that is associated with a leakage characteristic. The MEMS layer 230 can include a membrane cover that overlies the lower cavity region. The membrane cover can have an upper surface and a lower surface and can be disposed upon at least a portion of the semiconductor substrate 210. The membrane cover can be formed upon a portion of the semiconductor substrate 210 within a first low pressure environment, which can be a vacuum. In a specific embodiment, the lower surface of the membrane cover and a portion of the upper surface of the semiconductor substrate enable definition of a lower volumetric cavity, which can include the lower cavity region.

The cap layer 250 can include a capping structure having a lower surface, which can be coupled to the membrane cover at the interface layer 240. The capping structure can be coupled to the membrane cover within a second low pressure environment. The first low pressure environment can be substantially similar to the second low pressure environment. In a specific embodiment, the capping structure can be formed from another semiconductor substrate and the capping structure can include a plurality of sidewall structures 253. These sidewall structures can enable definition of the upper volumetric cavity. In a specific embodiment, the upper surface of the membrane cover and the lower surface of the capping structure can enable definition of an upper volumetric cavity, which can include the upper cavity region. In this embodiment, the upper volumetric cavity and the lower volumetric cavity are connected through openings in the MEMS layer 230.

In a specific embodiment, a plurality of displacement sensors 260 can be configured adjacent to the membrane cover. The plurality of displacement sensors can be configured to determine a displacement of the membrane cover towards to upper volumetric cavity or towards the lower volumetric cavity. The plurality of displacement sensors can include capacitors, movable electrodes, fixed electrodes, and the like.

In this embodiment, the upper volumetric cavity and the lower volumetric are separated a process control monitor structure which can include the membrane layer. The membrane layer covers and encloses major exposed areas of the CMOS layers in the CMOS substrate 210. The pressure of the upper volumetric cavity and the lower volumetric cavity divided by the membrane are the same without leaking or outgassing, which means no pressure difference is applied and thus the membrane 220 will not be deformed. In a specific embodiment, an initial gas pressure of the lower volumetric cavity and an initial gas pressure of the lower volumetric cavity are substantially similar.

Figure 3:
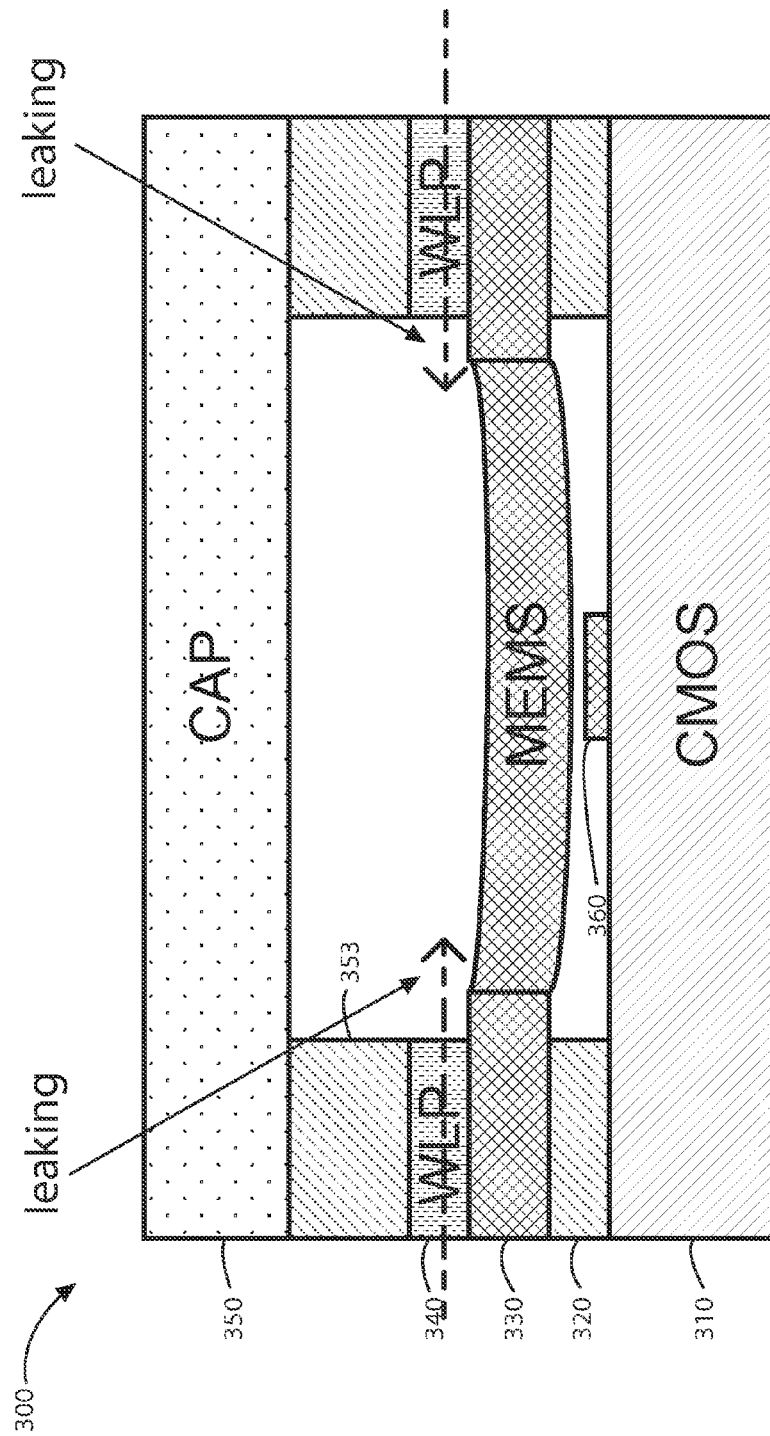

FIG. 3 illustrates a simplified diagram of an integrated MEMS device using a Process Control Monitor according to an embodiment of the present invention. This figure shows a cross-sectional view of an integrated MEMS device 300 similar to that of FIG. 2. Device 300 configured from bottom to top with the following device layers: a semiconductor substrate 310, a material layer 320, a MEMS material layer 330, an interface layer 340, and a cap layer 350. Specific details regarding these elements are described previously for device 200 of FIG. 2.

Compared to device 200 of FIG. 2, device 300 shows leakage at the interface layer 340, which degrades the vacuum of the upper cavity region or upper volumetric cavity. This degradation renders the pressure of the upper cavity region higher than that of the lower cavity region or lower volumetric cavity, which results in an applied downward force on the membrane 330 due to the pressure difference. The downward force causes the membrane to deform and deflect towards the lower cavity region. Here, the upper volumetric cavity and the lower volumetric cavity can have dissimilar volumes. In a specific embodiment, the MEMS membrane layer 320 can include one or more displacement sensors 360, which can include capacitors. The deformation of the membrane 320 can be read out by the change in capacitance of the displacement sensors.

Figure 4:
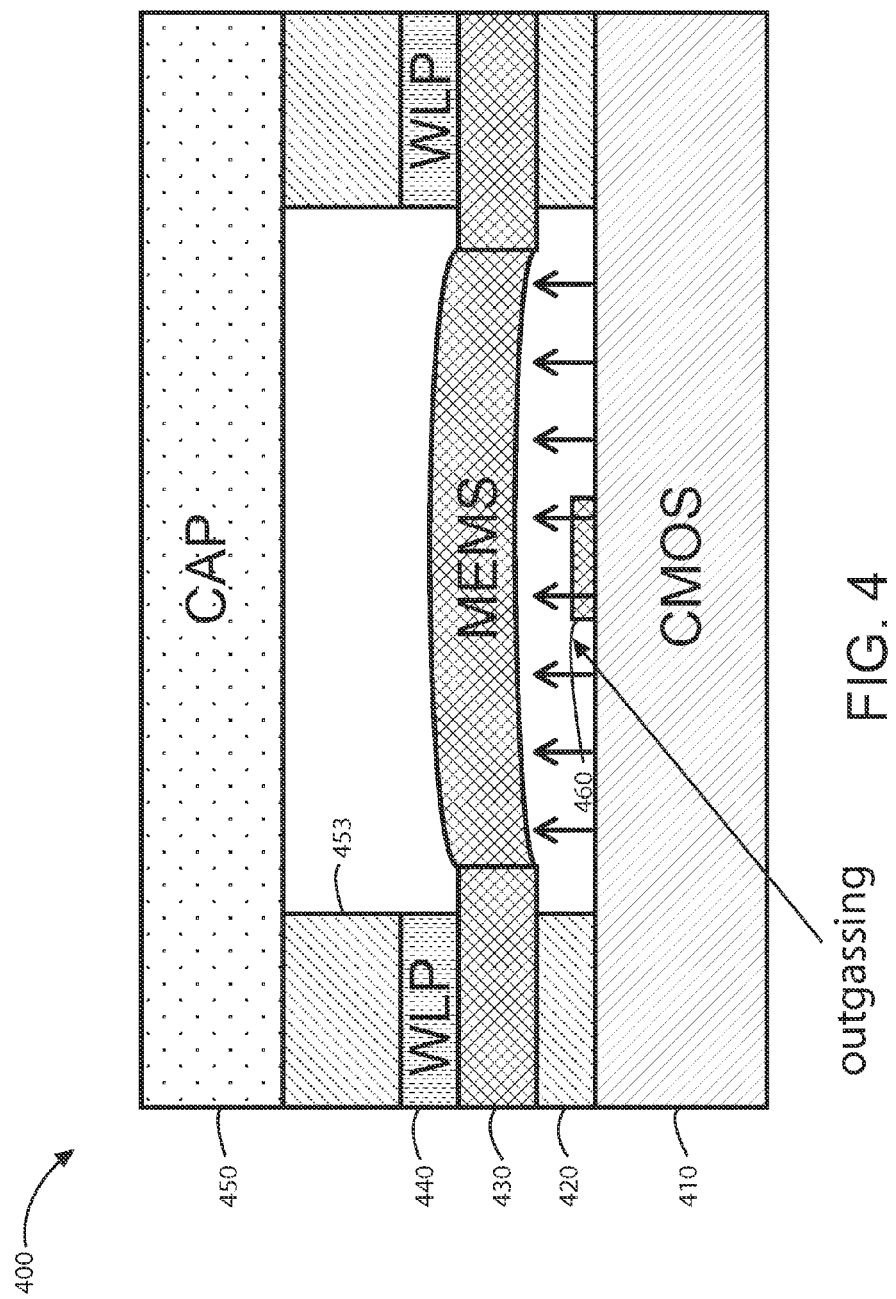

FIG. 4 illustrates a simplified diagram of an integrated MEMS device using a Process Control Monitor according to an embodiment of the present invention. This figure shows a cross-sectional view of an integrated MEMS device 400 similar to that of FIG. 2. Device 400 configured from bottom to top with the following device layers: a semiconductor substrate 410, a material layer 420, a MEMS material layer 430, an interface layer 440, and a cap layer 450. Specific details regarding these elements are described previously for device 200 of FIG. 2.

Compared to device 200 of FIG. 2, device 400 shows outgassing from the CMOS layers of the CMOS substrate 410, which degrades the vacuum of the upper cavity region or upper volumetric cavity. This degradation renders the pressure of the lower cavity region or lower volumetric cavity higher than that of the upper cavity region, which results in an applied upward force on the membrane 430 due to the pressure difference. The upward force causes the membrane to deform and deflect towards the upper cavity region. Similar to the previous embodiment, the MEMS membrane layer 430 can include one or more displacement sensors 460, which can include capacitors. The deformation of the membrane 420 can be read out by the change in capacitance of the displacement sensors.

Process control and improvement are key elements of MEMS product development that contribute to a majority of development time as MEMS products are highly sensitive and coupled with critical process parameters. For example, one of the most critical process parameters for the gyroscope is air pressure inside a capping/package cavity, but the primary process issues involve degrading vacuum conditions due to leaking at capping/package interfaces and outgassing inside capping/package cavities. Being able to identify/decouple abnormal leaking and outgassing in the MEMS process and production allows for correcting fixes/tuning to be applied, which will significantly reduce undesirable factors such as developmental efforts and time to market.

Embodiments of the present invention provide a Process Control Monitor design for MEMS package leaking and outgassing. The Process Control Monitor can monitor and distinguish vacuum degradation from leaking versus outgassing. The Process Control Monitor can include a MEMS membrane inside a capping structure. The membrane can divide an upper and lower cavity and can be used to distinguish vacuum degradation from leaking at WLP interface regions or from outgassing of the CMOS layers.

Figure 5:
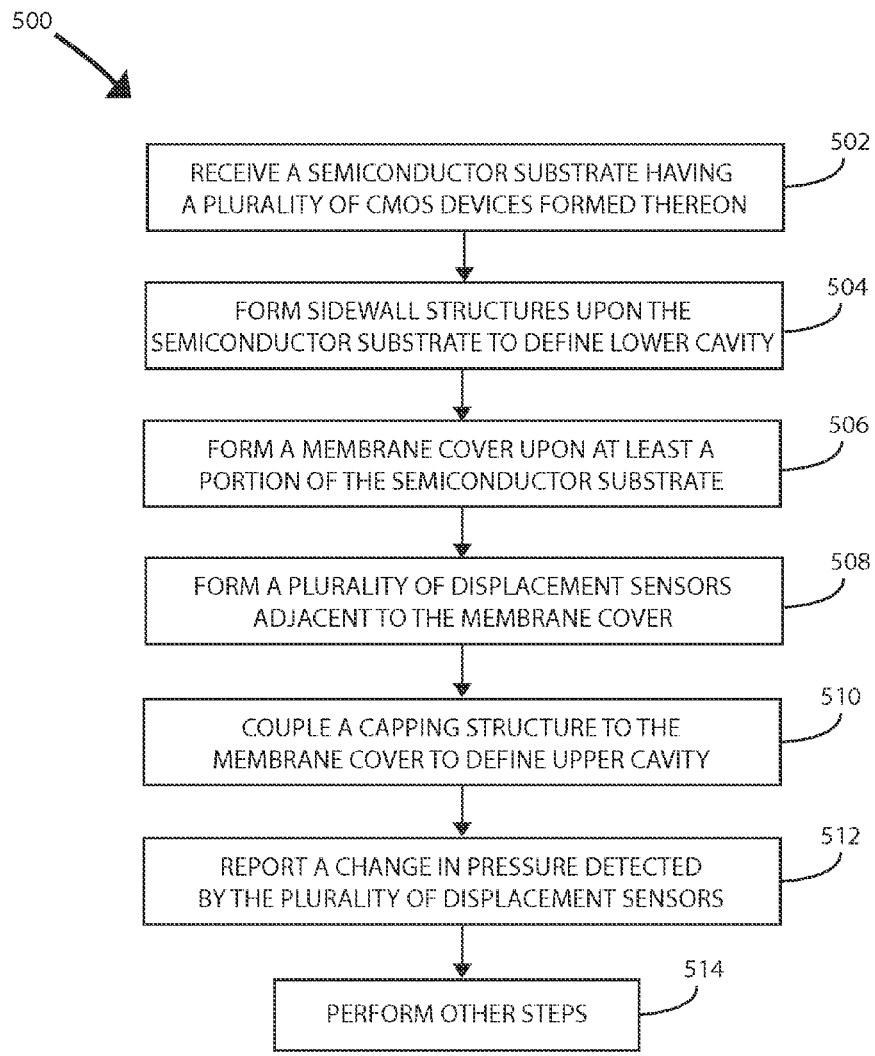
FIG. 5 illustrates a simplified flow diagram of a method for forming a pressure control sensor according to an embodiment of the present invention.

FIG. 5 is a simplified flow diagram of a method for forming a pressure control sensor according to an embodiment of the present invention. As shown, the method 500 can include the following steps:

502. receive a semiconductor substrate having a plurality of CMOS devices formed thereon, wherein the semiconductor substrate includes an upper surface, and wherein the upper surface of the semiconductor substrate is associated with an outgassing characteristic;

504. form sidewall structures upon the semiconductor substrate, wherein the sidewall structures formed upon the semiconductor substrate enable definition of a lower volumetric cavity;

506. form a membrane cover upon at least a portion of the semiconductor substrate, wherein the membrane cover includes an upper surface and a lower surface, wherein the lower surface of the membrane cover and a portion of the upper surface of the semiconductor substrate enable definition of the lower volumetric cavity;

508. form a plurality of displacement sensors adjacent to the membrane cover, wherein the plurality of displacement sensors are configured to determine a displacement of the membrane cover towards the upper or lower volumetric cavities;

510. couple a capping structure to the membrane cover at a bonding interface, wherein the bonding interface is associated with a leakage characteristic, wherein the capping structure includes a lower surface, wherein the upper surface of the membrane cover and lower surface of the capping structure enable definition of an upper volumetric cavity;

512. report a change in pressure detected by the plurality of displacement sensors by a change in capacitance values; and 514. Other steps as desired.

These steps are merely examples and should not unduly limit the scope of the claims herein. One of ordinary skill in the art would recognize many other variations, modifications, and alternatives. For example, various steps outlined above may be added, removed, modified, rearranged, repeated, and/or overlapped, as contemplated within the scope of the invention.

In an embodiment, the present invention provides a method of fabricating an process control monitor for an integrated MEMS device. The method 500 includes receiving a semiconductor substrate, step 502, having an upper surface that is associated with an outgassing characteristic. This substrate can have a plurality of CMOS devices formed thereon. Sidewall structures can be formed upon the semiconductor substrate, step 504. These sidewall structures can enable the definition of a lower volumetric cavity.

A membrane cover can be formed upon at least a portion of the semiconductor substrate, step 506. The membrane cover can be formed within a first low pressure environment, which can be approximately a vacuum. This membrane cover can include an upper surface and a lower surface. The lower surface of the membrane cover and a portion of the upper surface of the semiconductor substrate can enable the definition of the lower volumetric cavity. A plurality of displacement sensors can be formed adjacent to the membrane cover, step 508. The plurality of displacement sensors can be configured to determine a displacement of the membrane cover towards the upper volumetric cavity or towards the lower volumetric cavity. In a specific embodiment, the plurality of displacement sensors can include capacitors.

A capping structure with a lower surface can be coupled to the membrane cover at a bonding interface, step 510. The bonding interface can be associated with a leakage characteristic. The coupling of the capping structure can occur within a second low pressure environment. The upper surface of the membrane cover and the lower surface of the capping structure can enable the definition of an upper volumetric cavity. An initial gas pressure of the lower volumetric cavity and an initial gas pressure of the upper volumetric cavity can be substantially similar or dissimilar depending on the leaking and outgassing present within the device. If a displacement indicating a change in pressure is detected, this change can be reported by an output of change in capacitance values by the plurality of displacement sensors, step 512. Other details can be found in the descriptions for FIGS. 2-4. Other steps can be performed as desired, step 514.

Figure 6:
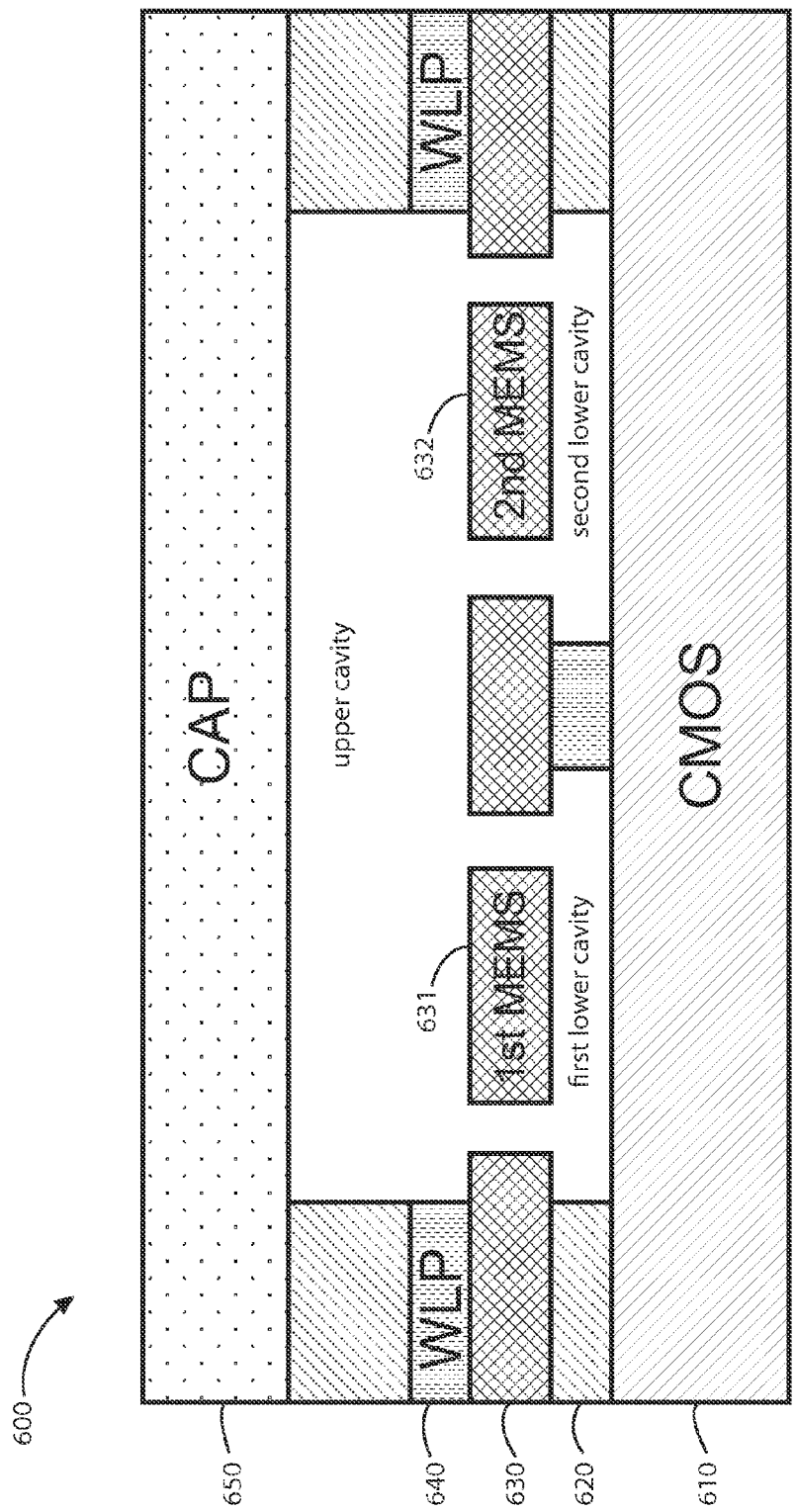
FIG. 6 illustrates a simplified diagram of an integrated multiple MEMS device within a single package having a single cavity pressure according to an embodiment of the present invention.

FIG. 6 illustrates a simplified diagram of an integrated multiple MEMS device within a single package having a single cavity pressure according to an embodiment of the present invention. This figure shows a cross-sectional view of an integrated MEMS device 600 similar to that of FIG. 2 with more than one MEMS device. Device 600 configured from bottom to top with the following device layers: a semiconductor substrate 610, a material layer 620, a MEMS material layer 630, an interface layer 640, and a cap layer 650. The MEMS layer 630 includes a first MEMS 631 and a second MEMS 632, which can be a gyroscope and accelerometer, respectively, or any other pair of MEMS devices. The interface layer 640 between the cap layer 650 and the MEMS layer 630 can be a WLP layer having an interface region. Here, the cap layer 650 encloses the first and second MEMS 631, 632 in a single cavity, thus sharing the same cavity pressure.

In integrated MEMS design, certain MEMS devices require different operating air pressures, some examples being a gyroscope and an accelerometer. This means that a package with two MEMS devices requiring different operating will require either separated MEMS packages or a single MEMS package with different packaging pressures. Both design approaches are challenging and complex, which tends to lead to low production yield. Addressing this design issue is a major key in developing a successful integrated multiple MEMS device, such as an integrated MEMS gyroscope and accelerometer.

A single MEMS package design is desirable as it provides a smaller form factor, smaller die size, and better process complexity. However, implementing different package pressures during a single MEMS packaging process can be extremely difficult. For example, using conformal thin-film enclosures of separated package cavities is not mechanically or process-oriented robust. Embodiments of the present invention provide a method and structure for a single MEMS package with different vacuum pressures using intrinsic outgassing. The outgassing can come from exposed CMOS layers that are enclosed in a package cavity, as described in FIG. 1. In a specific embodiment, intrinsic outgassing can be used to create different final cavity air pressures in separated package cavities with significantly different volumes.

Figure 7:
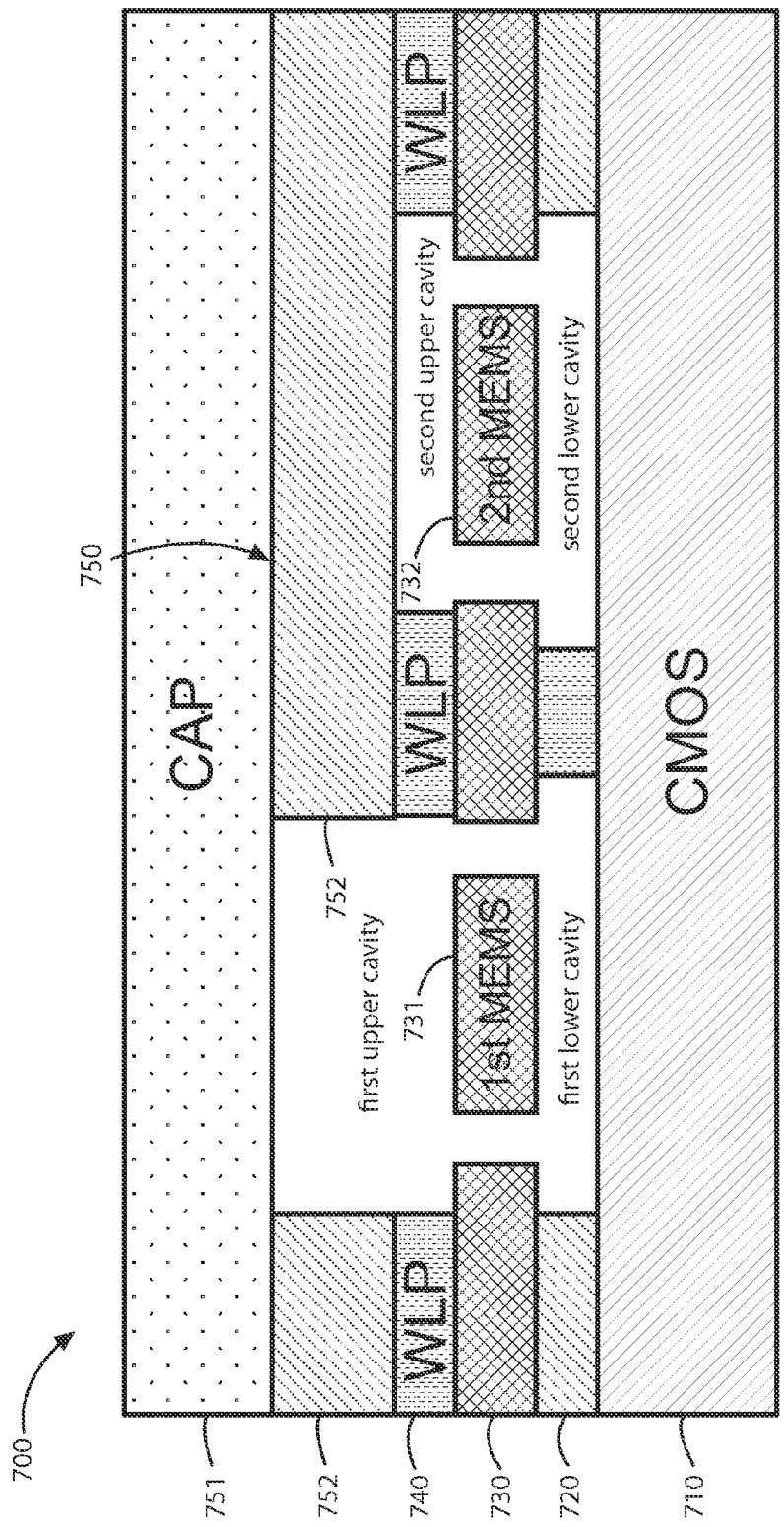
FIGS. 7 and 8 illustrate simplified diagrams of an integrated multiple MEMS device within a single package having separate cavity pressures according to an embodiment of the present invention.

FIG. 7 illustrates a simplified diagram of an integrated multiple MEMS device within a single package having separate cavity pressures according to an embodiment of the present invention. This figure shows a cross-sectional view of an integrated MEMS device 700 similar to that of FIG. 6, but with separate package cavities. Device 700 configured from bottom to top with the following device layers: a semiconductor substrate 710, a material layer 720, a MEMS material layer 730, an interface layer 740, and a cap layer 750. The MEMS layer 730 includes a first MEMS 731 and a second MEMS 732, which can be a gyroscope and accelerometer, respectively, or any other pair of MEMS devices.

The cap layer 750 includes a first cap 751 and a second cap 752. The second cap 752 is configured overlying the second MEMS 732 and the first cap 751 is configured overlying the first and second MEMS 731 and 732, as well as the second cap 752. The interface layer 740 between the cap layer 750 and the MEMS layer 730 can be a WLP layer having an interface region. Here, the second cap 752 encloses the second MEMS 732 in a second cavity that is separate from the first cavity wherein the first MEMS 731 is enclosed.

In a specific embodiment, the first MEMS 731 and the second MEMS 732, which are separated in different cavities, are exposed to different cavity air pressures due to the different cavity heights. For example, the second cavity with the second MEMS 732 has a lower cavity height, which results in a smaller cavity volume. By comparison, the first cavity with the first MEMS 731 has a higher cavity height, which results in a large cavity volume.

Figure 8:
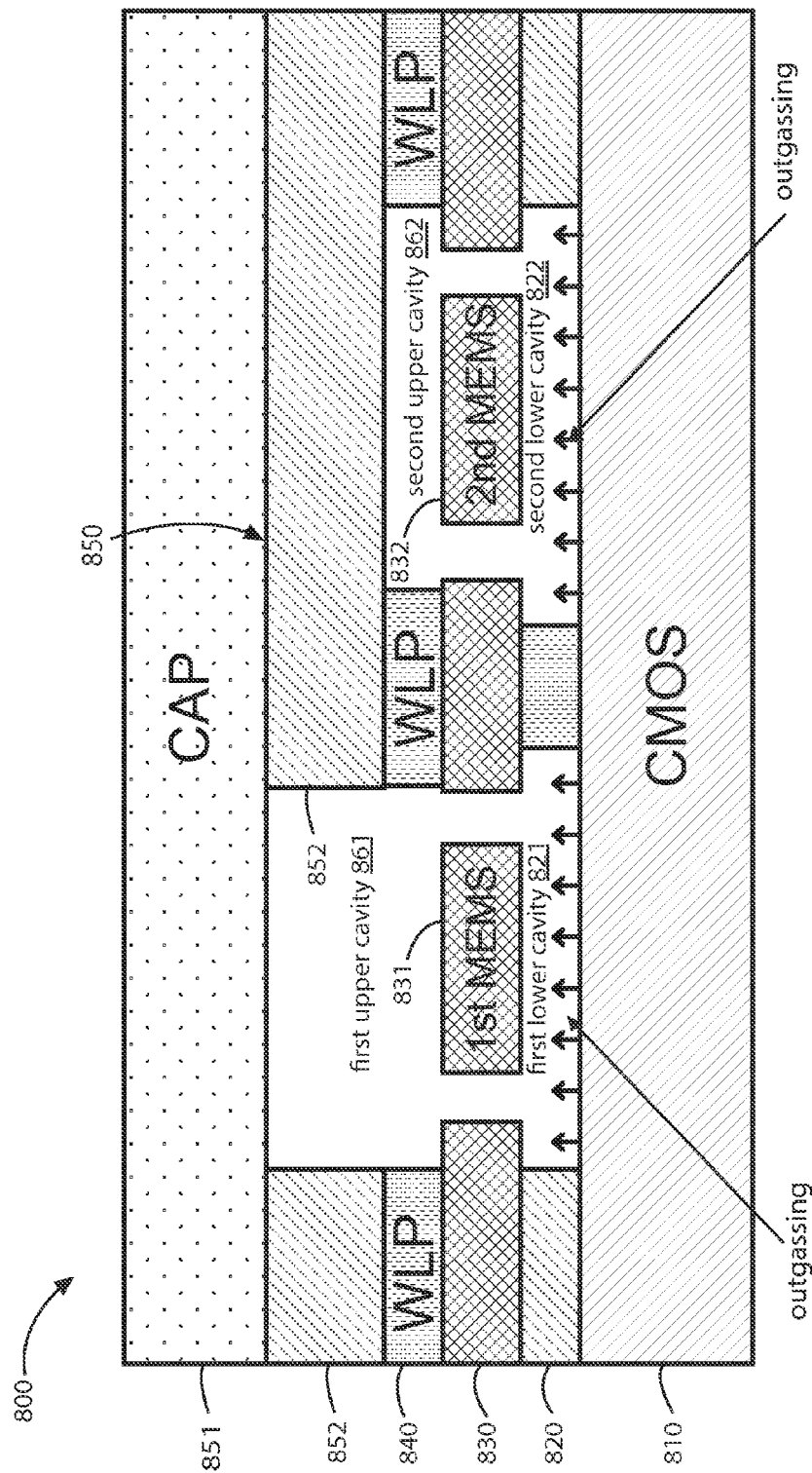

FIG. 8 illustrates a simplified diagram of an integrated multiple MEMS device within a single package having separate cavity pressures according to an embodiment of the present invention. This figure shows a cross-sectional view of an integrated MEMS device 800 similar to that of FIG. 7. Device 800 configured from bottom to top with the following device layers: a semiconductor substrate 810, a material layer 820, a MEMS material layer 830, an interface layer 840, and a cap layer 850. Those of ordinary skill in the art will recognize other variations, modifications, and alternatives.

The semiconductor substrate 810 includes a plurality of CMOS devices formed thereon and also includes an upper surface, which can be associated with an outgassing characteristic. The interface layer 820 can include a dielectric material layer, which can be disposed upon the semiconductor substrate 810 and can include a plurality of cavities formed thereon. The plurality of cavities includes a first lower cavity 821 and a second lower cavity 822, which expose portions of the upper surface of the semiconductor substrate 810. The MEMS material layer 830 includes a first MEMS 831 and a second MEMS 832, which can be a gyroscope and accelerometer, respectively, or any other pair of MEMS devices. The first MEMS 831 can be configured adjacent to the first lower cavity 821 and the second MEMS 832 can be configured adjacent to the second lower cavity 822.

The cap layer 850 can include a capping structure disposed above the interface layer 830, which can be a dielectric material layer. The capping structure can comprise a plurality of caps including a first upper cap 851 and a second upper cap 852. A bonding interface layer 840 is shown between the cap layer and the MEMS layer. In a specific embodiment, the capping structure can be coupled to the MEMS material layer 830 at the bonding interface layer 840. The second cap 852 is configured overlying the second MEMS 832 and the first cap 851 is configured overlying the first and second MEMS 831 and 832, as well as the second cap 852.

In a specific embodiment, the capping structure includes a capping substrate having a surface and a dielectric layer disposed above a surface of the capping structure. The plurality of cap regions can be etched within the dielectric layer to expose portions of the surface of the capping substrate and to form the first cap region and the second cap region. In another embodiment, the first cap region is etched within the dielectric layer to expose portions of the surface of the capping substrate, but the second cap region does not expose portions of the surface of the capping substrate. Furthermore, a wafer-level bonding material can be disposed between the capping structure and the dielectric material.

The first upper cap 851 and the first lower cavity 821 can form a first MEMS cavity with the first MEMS 831 disposed therein. The second upper cap 852 and the second lower cavity 822 can form a second MEMS cavity with the second MEMS 832 disposed therein. In another embodiment, the capping structure can include a plurality of cap regions including a first cap region 861 and a second cap region 862. In this case, the first cap region 861 and the first lower cavity 821 form the first MEMS cavity and the second cap region 862 and the second lower cavity 822 form the second MEMS cavity. The first and second MEMS cavities are separate from each other.

In an embodiment, the outgassing characteristic of the semiconductor substrate 810 can be utilized to form different cavity pressures or gas pressures within the separate MEMS cavities. An initial gas pressure of the first MEMS cavity and the initial gas pressure of the second MEMS cavity can be substantially similar. However, the volume of the first MEMS cavity can be different from that of the second MEMS cavity while the volume of the first lower cavity can be substantially similar to the volume of the second lower cavity. In a specific embodiment, the volume of the second cap region is less than a volume of the first cap region. This difference in volume can be due to the second cap region having a depth or height that is less than that of the first cap region.

The large cavity volume for the first MEMS 831 can have a desirable low pressure with minimal air pressure contributed by outgassing. By comparison, the small cavity volume of the second MEMS 832 can have a desirable high pressure with maximal air pressure contributed by outgassing. Varying levels of cavity air pressures can be created within separate cavity regions created by different cap structures having different cavity heights. Of course, there can be other variations, modifications, and alternatives.

Figure 9:
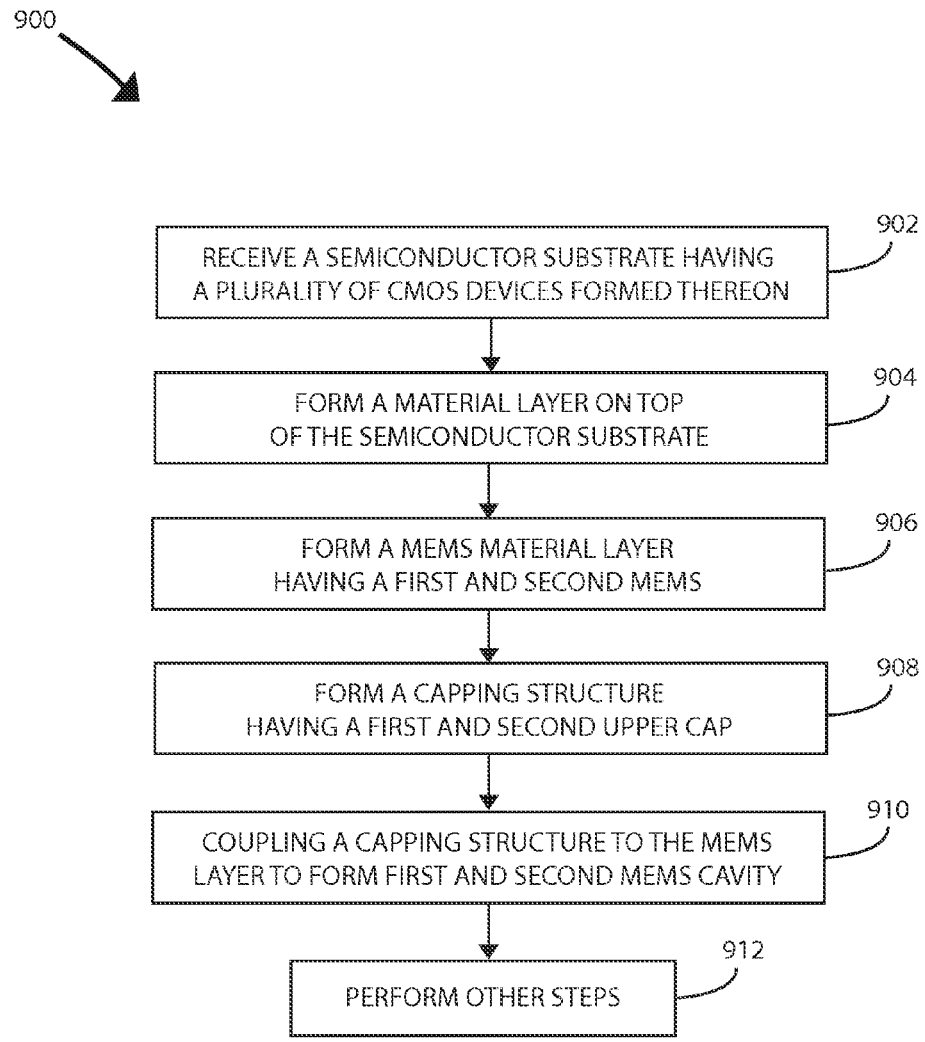
FIG. 9 illustrates a simplified flow diagram of a method for fabricating an integrated MEMS device having separate cavity pressures according to an embodiment of the present invention.

FIG. 9 illustrates a simplified flow diagram of a method for fabricating an integrated MEMS device having separate cavity pressures according to an embodiment of the present invention. As shown, the method 900 can include the following steps:

902. receive a semiconductor substrate having a plurality of CMOS devices formed thereon, wherein the semiconductor substrate includes an upper surface, and wherein the upper surface of the semiconductor substrate is associated with an outgassing characteristic;

904. form a material layer on top of the semiconductor substrate, wherein the material layer includes a first lower cavity and a second lower cavity;

906. form a MEMS material layer comprising a first MEMS device on top of the first lower cavity and a second MEMS device on top of the second lower cavity;

908. form a capping structure comprising a plurality of caps including a first upper cap and a second upper cap;

910. couple the capping structure to the MEMS material layer at a bonding interface, wherein the first upper cap and first lower cavity form a first MEMS cavity, wherein the first MEMS device is disposed therein, wherein the second upper cap and the second lower cavity form a second MEMS cavity, wherein the second MEMS device is disposed therein, wherein the first MEMS cavity is separate from the second MEMS cavity; and 912. Other steps as desired.

These steps are merely examples and should not unduly limit the scope of the claims herein. One of ordinary skill in the art would recognize many other variations, modifications, and alternatives. For example, various steps outlined above may be added, removed, modified, rearranged, repeated, and/or overlapped, as contemplated within the scope of the invention.

In an embodiment, the present invention provides a method of fabricating an integrated MEMS device. The method 900 can include receiving a semiconductor substrate having a plurality of CMOS devices formed thereon, step 902. The semiconductor substrate can include an upper surface, which is associated with an outgassing characteristic.

A material layer can be formed on top of the semiconductor substrate, step 904. The material layer can include a first lower cavity and a second lower cavity. Forming the material layer can include forming a dielectric layer above the upper surface of the semiconductor substrate. The portions of the dielectric layer can be etched to expose portions of the upper surface of the semiconductor substrate and to form the first lower cavity and the second lower cavity. A MEMS material layer can be formed on top of the semiconductor substrate, step 906. The MEMS material layer can include a first MEMS device on top of the first lower cavity and a second MEMS device on top of the second lower cavity. In a specific embodiment, the first MEMS can be a gyroscope and the second MEMS can be an accelerometer.

A capping structure can be formed with a plurality of caps, which can include a first upper cap and a second upper cap, step 908. Forming the capping structure can include receiving a capping substrate and forming a dielectric layer above a surface of the capping substrate. Portions of this dielectric layer can be etched to expose portions of the surface of the capping substrate and to form the first upper cap and the second upper cap. In another embodiment, portions of the dielectric layer can be etched to expose portions of the surface of the capping substrate and to form the first upper cap. However, the second upper cap is not exposed to portions of the surface of the capping structure. In various embodiments, the depths or heights of the first upper cap and the second upper cap can be controlled by the etching process.

The capping structure can be coupled to the MEMS material layer at a bonding interface, step 910. The first upper cap and the first lower cavity can form a first MEMS cavity with the first MEMS device disposed therein. The second upper cap and the second lower cavity form a second MEMS cavity with the second MEMS device disposed therein. The first MEMS cavity is separate from the second MEMS cavity.

An initial gas pressure of the first MEMS cavity and an initial gas pressure of the second MEMS cavity can be substantially similar. Also, a volume of the first lower cavity can be substantially similar to a volume of the second lower cavity. However, a volume of the first MEMS cavity can be different from a volume of the second MEMS cavity. In a specific embodiment, the volume difference can be due to a volume of the second upper cap being less than a volume of the first upper cap. Specifically, a depth of the second upper cap can be less than a depth of the first upper cap, which can be due to the etching of a dielectric layer formed above a surface of a capping substrate, as described previously.

The outgassing characteristic of the semiconductor substrate causes a gas pressure of the first MEMS cavity to be different from a gas pressure of the second MEMS cavity. This allows each MEMS device within its respective cavity to operate at separate cavity air pressures. Other steps can be performed as desired, step 912.

Figure 10:
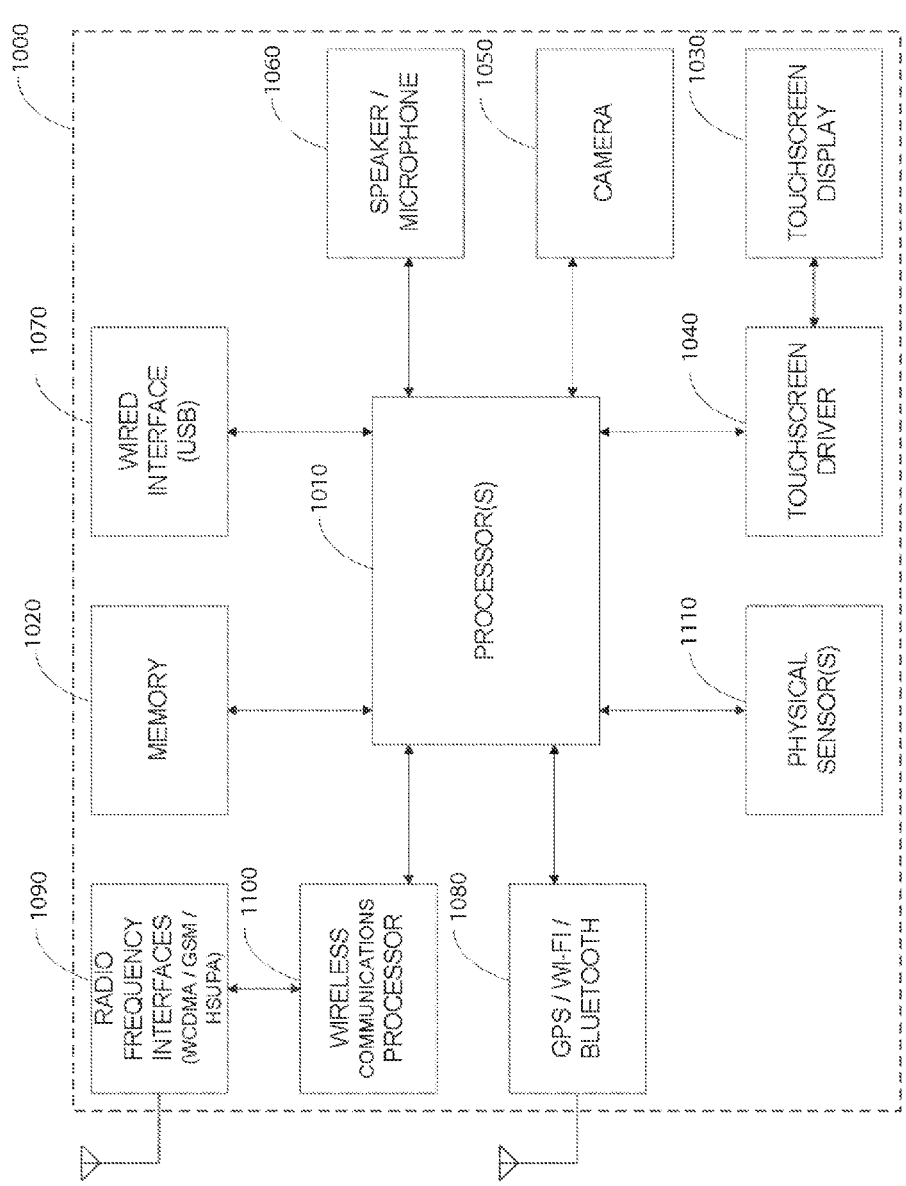
FIG. 10 illustrates a simplified functional block diagram of various embodiments of the present invention.

FIG. 10 illustrates a functional block diagram of various embodiments of the present invention. In FIG. 10, a computing device 1000 typically includes an applications processor 1010, memory 1020, a touch screen display 1030 and driver 1040, an image acquisition device 1050, audio input/output devices 1060, and the like. Additional communications from and to computing device are typically provided by via a wired interface 1070, a GPS/Wi-Fi/Bluetooth interface 1080, RF interfaces 1090 and driver 1100, and the like. Also included in various embodiments are physical sensors 1110.

In various embodiments, computing device 1000 may be a hand-held computing device (e.g. Apple iPad, Apple iTouch, Dell Mini slate, Lenovo Skylight/IdeaPad, Asus EEE series, Microsoft Courier, Notion Ink Adam), a portable telephone (e.g. Apple iPhone, Motorola Droid, Google Nexus One, HTC Incredible/EVO 4G, Palm Pre series, Nokia N900), a portable computer (e.g. netbook, laptop), a media player (e.g. Microsoft Zune, Apple iPod), a reading device (e.g. Amazon Kindle, Barnes and Noble Nook), or the like.

Typically, computing device 1000 may include one or more processors 1010. Such processors 1010 may also be termed application processors, and may include a processor core, a video/graphics core, and other cores. Processors 1010 may be a processor from Apple (A4), Intel (Atom), NVidia (Tegra 2), Marvell (Armada), Qualcomm (Snapdragon), Samsung, TI (OMAP), or the like. In various embodiments, the processor core may be an Intel processor, an ARM Holdings processor such as the Cortex-A, -M, -R or ARM series processors, or the like. Further, in various embodiments, the video/graphics core may be an Imagination Technologies processor PowerVR-SGX, -MBX, -VGX graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 1020 may include different types of memory (including memory controllers), such as flash memory (e.g. NOR, NAND), pseudo SRAM, DDR SDRAM, or the like. Memory 1020 may be fixed within computing device 1000 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, touch screen display 1030 and driver 1040 may be based upon a variety of later-developed or current touch screen technology including resistive displays, capacitive displays, optical sensor displays, electromagnetic resonance, or the like. Additionally, touch screen display 1030 may include single touch or multiple-touch sensing capability. Any later-developed or conventional output display technology may be used for the output display, such as TFT-LCD, OLED, Plasma, trans-reflective (Pixel Qi), electronic ink (e.g. electrophoretic, electrowetting, interferometric modulating). In various embodiments, the resolution of such displays and the resolution of such touch sensors may be set based upon engineering or non-engineering factors (e.g. sales, marketing). In some embodiments of the present invention, a display output port, such as an HDMI-based port or DVI-based port may also be included.

In some embodiments of the present invention, image capture device 1050 may include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, or the like.

In various embodiments, audio input/output 1060 may include conventional microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 1010 to enable the user to operate computing device 1000 by stating voice commands. Additionally, a speech engine may be provided in various embodiments to enable computing device 1000 to provide audio status messages, audio response messages, or the like.

In various embodiments, wired interface 1070 may be used to provide data transfers between computing device 1000 and an external source, such as a computer, a remote server, a storage network, another computing device 1000, or the like. Such data may include application data, operating system data, firmware, or the like. Embodiments may include any later-developed or conventional physical interface/protocol, such as: USB 2.0, 3.0, micro USB, mini USB, Firewire, Apple iPod connector, Ethernet, POTS, or the like. Additionally, software that enables communications over such networks is typically provided.

In various embodiments, a wireless interface 1080 may also be provided to provide wireless data transfers between computing device 1000 and external sources, such as computers, storage networks, headphones, microphones, cameras, or the like. As illustrated in FIG. 10, wireless protocols may include Wi-Fi (e.g. IEEE 802.11a/b/g/n, WiMax), Bluetooth, IR and the like.

GPS receiving capability may also be included in various embodiments of the present invention, however is not required. As illustrated in FIG. 10, GPS functionality is included as part of wireless interface 1080 merely for sake of convenience, although in implementation, such functionality is currently performed by circuitry that is distinct from the Wi-Fi circuitry and distinct from the Bluetooth circuitry.

Additional wireless communications may be provided via RF interfaces 1090 and drivers 1100 in various embodiments. In various embodiments, RF interfaces 1090 may support any future-developed or conventional radio frequency communications protocol, such as CDMA-based protocols (e.g. WCDMA), GSM-based protocols, HSUPA-based protocols, or the like. In the embodiments illustrated, driver 1100 is illustrated as being distinct from applications processor 1010. However, in some embodiments, these functionality are provided upon a single IC package, for example the Marvel PXA330 processor, and the like. It is contemplated that some embodiments of computing device 1000 need not include the RF functionality provided by RF interface 1090 and driver 1100.

FIG. 10 also illustrates computing device 1000 to include physical sensors 1110. In various embodiments of the present invention, physical sensors 1110 can be single axis or multi-axis Micro-Electro-Mechanical Systems (MEMS) based devices being developed by M-cube, the assignee of the present patent application. Physical sensors 1110 can include accelerometers, gyroscopes, pressure sensors, magnetic field sensors, bio sensors, and the like. In other embodiments of the present invention, conventional physical sensors 1110 from Bosch, STMicroelectronics, Analog Devices, Kionix or the like may be used.

In various embodiments, any number of future developed or current operating systems may be supported, such as iPhone OS (e.g. iOS), WindowsMobile (e.g. 7), Google Android (e.g. 2.2), Symbian, or the like. In various embodiments of the present invention, the operating system may be a multi-threaded multi-tasking operating system. Accordingly, inputs and/or outputs from and to touch screen display 1030 and driver 1040 and inputs/or outputs to physical sensors 1110 may be processed in parallel processing threads. In other embodiments, such events or outputs may be processed serially, or the like. Inputs and outputs from other functional blocks may also be processed in parallel or serially, in other embodiments of the present invention, such as image acquisition device 1050 and physical sensors 1110.

FIG. 10 is representative of one computing or micro-processing device 1000 capable of embodying the present invention. The previously described methods of operation can be implemented with on-chip logic or through a micro-processor in the same device or in a separate chip within the hand-held device. It will be readily apparent to one of ordinary skill in the art that many other hardware and software configurations are suitable for use with the present invention. Embodiments of the present invention may include at least some but need not include all of the functional blocks illustrated in FIG. 10. For example, in various embodiments, computing device 1000 may lack image acquisition unit 1050, or RF interface 1090 and/or driver 1100, or GPS capability, or the like. Additional functions may also be added to various embodiments of computing device 1000, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

According to some embodiment of the present invention, a method for forming a pressure control monitor includes receiving a semiconductor substrate having a plurality of CMOS devices formed thereon, wherein the semiconductor substrate includes an upper surface, and wherein the upper surface of the semiconductor substrate is associated with an outgassing characteristic. The method also includes forming a membrane cover upon at least a portion of the semiconductor substrate, wherein the membrane cover includes an upper surface and a lower surface, wherein the lower surface of the membrane cover and a portion of the upper surface of the semiconductor substrate enable definition of a lower volumetric cavity. The method also includes coupling a capping structure to the membrane cover at a bonding interface, wherein the bonding interface is associated with a leakage characteristic, wherein the capping structure includes a lower surface, wherein the upper surface of the membrane cover and lower surface of the capping structure enable definition of an upper volumetric cavity. In an embodiment, the upper volumetric cavity and the lower volumetric cavity are separated by the membrane cover. In another embodiment, the upper volumetric cavity and the lower volumetric cavity have dissimilar volumes.

In an embodiment of the above invention, an initial gas pressure of the lower volumetric cavity and an initial gas pressure of the upper volumetric cavity are substantially similar. In some embodiments, the method also includes forming a plurality of displacement sensors adjacent to the membrane cover, wherein the plurality of displacement sensors are configured to determine a displacement of the membrane cover towards the upper volumetric cavity or towards the lower volumetric cavity. In an embodiment, the plurality of displacement sensors comprise capacitors.

In another embodiment, the above method also includes, prior to the forming of the membrane cover, forming sidewall structures upon the semiconductor substrate, in which the sidewall structures enable definition of the lower volumetric cavity. In another embodiment, the method also includes forming a capping structure from another semiconductor substrate, wherein the capping structure comprises a plurality of sidewall structures upon the other semiconductor substrate, wherein the sidewall structures enable definition of the upper volumetric cavity.

In some embodiments of the above invention the forming of the membrane cover comprises forming the membrane cover upon a portion of the semiconductor substrate within a first low pressure environment. In an embodiment, the coupling of the capping structure comprises coupling the capping structure to the membrane cover within a second low pressure environment, and the first low pressure environment and the second low pressure environment are substantially similar. In an embodiment, the first low pressure environment is approximately a vacuum.

According to other embodiments of the present invention, a method for monitoring MEMS device fabrication processes includes receiving a semiconductor substrate having a plurality of CMOS devices formed thereon, wherein the semiconductor substrate includes an upper surface, wherein the upper surface of the semiconductor substrate is associated with an outgassing characteristic, wherein a membrane cover is formed upon at least a portion of the semiconductor substrate, wherein the membrane cover includes an upper surface and a lower surface, wherein the lower surface of the membrane cover and a portion of the upper surface of the semiconductor substrate enable definition of a bottom volumetric cavity, and wherein a capping structure is coupled to the membrane cover at a bonding interface, wherein the bonding interface is associated with a leakage characteristic, wherein the capping structure includes a lower surface, wherein the upper surface of the membrane cover and the lower surface of the capping structure enable definition of an upper volumetric cavity, and wherein the upper volumetric cavity and the lower volumetric cavity are separated by the membrane cover.

In an embodiment of the above method, an initial gas pressure of the lower volumetric cavity and an initial gas pressure of the upper volumetric cavity are substantially similar. In another embodiment, a change in pressure in the upper volumetric cavity with respect to changes in pressure in the lower volumetric cavity are determined by a plurality of displacement sensors adjacent to the membrane cover. In another embodiment, the semiconductor substrate comprises sidewall structures, and wherein the sidewall structures enable definition of the lower volumetric cavity. In another embodiment, the capping structure comprises a plurality of sidewall structures, wherein the plurality of sidewall structures enable definition of the upper volumetric cavity.

In some embodiments of the above method, the upper volumetric cavity is initially associated with a first low pressure environment. In another embodiment, the lower volumetric cavity is initially associated with a second low pressure environment, and the first low pressure environment and the second low pressure environment are substantially similar. In another embodiment, wherein the first low pressure environment is approximately a vacuum.

In another embodiment of the above method, the upper volumetric cavity and the lower volumetric cavity have dissimilar volumes. In another embodiment, the method also includes reporting a change in pressure, wherein the reporting of change in pressure comprises outputting a change in capacitance value.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating an integrated MEMS (Micro Electro Mechanical System) device comprising:
receiving a semiconductor substrate having a plurality of CMOS devices formed thereon, wherein the semiconductor substrate includes an upper surface, and wherein the upper surface of the semiconductor substrate is associated with an outgassing characteristic;
forming a material layer on top of the semiconductor substrate, wherein the material layer includes a first lower cavity and a second lower cavity;
forming a MEMS material layer comprising a first MEMS device on top of the first lower cavity and a second MEMS device on top of the second lower cavity;
forming a capping structure comprising a plurality of caps including a first upper cap and a second upper cap, wherein forming the capping structure includes:
receiving a capping structure,
forming a dielectric layer above a surface of the capping substrate, and
etching portions of the dielectric layer to expose portions of the surface of the capping substrate and to form the first upper cap and the second upper cap;
coupling the capping structure to the MEMS material layer at a bonding interface, wherein the first upper cap and first lower cavity from a first MEMS cavity, wherein the first MEMS device is disposed therein, wherein the second upper cap and the second lower cavity form a second MEMS cavity, wherein the second MEMS device is disposed therein, wherein the first MEMS cavity is separate from the second MEMS cavity; and
wherein the outgassing characteristic of the semiconductor substrate causes a gas pressure of the first MEMS cavity to be different from a gas pressure of the second MEMS cavity.

2. The method of claim 1 wherein an initial gas pressure of the first MEMS cavity and an initial gas pressure of the second MEMS cavity are substantially similar.

3. The method of claim 1 wherein a volume of the first MEMS cavity is different form a volume of the second MEMS cavity.

4. The method of claim 1
wherein the first MEMS device comprises a gyroscope; and
wherein the second MEMS device comprises an accelerometer.

5. The method of claim 1 wherein a volume of the first lower cavity is substantially similar to a volume of the second lower cavity.

6. The method of claim 1 wherein a volume of the second upper cap is less than a volume of the first upper cap.

7. The method of claim 6 wherein a depth of the second upper cap is less than a depth of the first upper cap.

8. The method of claim 1 wherein the forming of the material layer on top of the semiconductor substrate comprises
forming a dielectric layer above the upper surface of the semiconductor substrate; and
etching portions of the dielectric layer to expose portions of the upper surface of the semiconductor substrate and to form the first lower cavity and the second lower cavity.

9. A method for fabricating an integrated MEMS (Micro Electro Mechanical System) device comprising:
receiving a semiconductor substrate having a plurality of CMOS devices formed thereon, wherein the semiconductor substrate includes an upper surface, and wherein the upper surface of the semiconductor substrate is associated with an outgassing characteristic;

forming a material layer on top of the semiconductor substrate, wherein the material layer includes a first lower cavity and a second lower cavity;

forming a MEMS material layer comprising a first MEMS device on top of the first lower cavity and a second MEMS device on top of the second lower cavity;

forming a capping structure comprising a plurality of caps including a first upper cap and a second upper cap, wherein the forming of the capping structure comprises:
   receiving a capping substrate,
   forming a dielectric layer above a surface of the capping substrate, and
   etching portions of the dielectric layer to expose portions of the surface of the capping substrate and to form the first upper cap,
   wherein the second upper cap is not exposed to portions of the surface of the capping structure, coupling the capping structure to the MEMS material layer at a bonding interface, wherein the first upper cap and first lower cavity from a first MEMS cavity, wherein the first MEMS device is disposed therein, wherein the second upper cap and the second lower cavity form a second MEMS cavity, wherein the second MEMS device is disposed therein, wherein the first MEMS cavity is separate from the second MEMS cavity; and wherein the outgassing characteristic of the semiconductor substrate causes a gas pressure of the first MEMS cavity to be different from a gas pressure of the second MEMS cavity.

\* \* \* \* \*